United States Patent
Hawkins et al.

[11] Patent Number: 5,880,997
[45] Date of Patent: Mar. 9, 1999

[54] BUBBLEBACK FOR FIFOS

[75] Inventors: Andrew L. Hawkins; Muthukumar Nagarajan; Ajay Srikrishna, all of Starkville, Miss.

[73] Assignee: Cypress Semiconductor Corp., San Jose, Calif.

[21] Appl. No.: 939,463

[22] Filed: Sep. 29, 1997

Related U.S. Application Data

[63] Continuation of Ser. No. 576,944, Dec. 22, 1995, abandoned.

[51] Int. Cl.$^6$ .................................................. G11C 16/04
[52] U.S. Cl. ................................. 365/189.01; 365/189.05
[58] Field of Search ................... 365/78, 189.01, 365/189.05

[56] References Cited

U.S. PATENT DOCUMENTS

| | | | |
|---|---|---|---|
| 4,802,122 | 1/1989 | Auvinen et al. | 365/154 |
| 4,839,866 | 6/1989 | Ward et al. | 365/221 |
| 4,875,196 | 10/1989 | Spaderna et al. | 365/238 |
| 4,891,788 | 1/1990 | Kreifels | 365/49 |
| 5,084,837 | 1/1992 | Matsumoto et al. | 395/250 |
| 5,088,061 | 2/1992 | Golnabi et al. | 365/189.01 |
| 5,228,002 | 7/1993 | Huang | 365/221 |
| 5,262,996 | 11/1993 | Shiue | 365/78 |
| 5,305,253 | 4/1994 | Ward | 365/73 |
| 5,311,475 | 5/1994 | Huang | 365/221 |
| 5,317,756 | 5/1994 | Komatsu et al. | 395/800 |
| 5,367,486 | 11/1994 | Mori et al. | 365/189.05 |
| 5,404,332 | 4/1995 | Sato et al. | 365/201 |
| 5,406,273 | 4/1995 | Nishida et al. | 340/825.51 |
| 5,406,554 | 4/1995 | Parry | 370/58.1 |
| 5,426,612 | 6/1995 | Ichige et al. | 365/220 |
| 5,467,319 | 11/1995 | Nusinov et al. | 365/189.05 |
| 5,490,257 | 2/1996 | Hoberman et al. | 395/427 |
| 5,506,809 | 4/1996 | Csoppenszky et al. | 365/221 |
| 5,513,318 | 4/1996 | van de Goor et al. | 395/185.01 |
| 5,521,876 | 5/1996 | Hattori et al. | 365/221 |
| 5,546,347 | 8/1996 | Ko et al. | 365/221 |

FOREIGN PATENT DOCUMENTS

| | | |
|---|---|---|
| 0113996 | 8/1989 | Japan . |
| 0676559 | 6/1994 | Japan . |

*Primary Examiner*—David Nelms
*Assistant Examiner*—Trong Phan
*Attorney, Agent, or Firm*—Maiorana & Acosta, P.C.; Christopher P. Maiorana

[57] ABSTRACT

A method and apparatus for greatly simplifying the circuitry needed to handle the bubbleback situations in FIFO memories includes an additional row of cells added to the memory array. By adding an extra row of memory cells, the read and write pointer are only on the same row when the FIFO is operating near the empty boundary or in fallthrough mode.

11 Claims, 2 Drawing Sheets

FIG I(b): BUBBLEBACK CONDITION WITH 'n' ROWS

BUBBLEBACK FOR FIFOS

This is a Continuation of U.S. patent application Ser. No. 08/576,944, filed Dec. 22, 1995, now abandoned.

BACKGROUND OF THE INVENTION

1. Field of the Invention

The present invention relates to data reading and data writing in FIFO memories and more particularly to writing data in nearly full FIFO memories.

2. Related Prior Art

Typical FIFO buffer memories are made up of an array of memory cells with enough rows and columns to support the width and depth of FIFO needed. Rows are defined as being accessed by a wordline, columns are defined as being accessed by column select circuitry. Typically the column pointers are incremented until the end of the row and then reset to the first location at the same time the row pointer is incremented to the next location. In this description, a read or write pointer will be considered to be the location being accessed by both the row pointer and the column pointer. Boundary flags, Full and Empty, control whether or not the FIFO can be written to or read from when the FIFO is full of data and when the FIFO is empty of data, respectively. When writing to the memory array, the write pointer is incremented until the writes are complete or the Full flag inhibits further writes. If the write pointer reaches the end, or bottom, of the array and the Full flag is not preventing more writes from occurring, the write pointer simply wraps around and writes the cells that have already been read out with new data. Although this is a very efficient use of the memory array, allowing the write pointer and read pointer to operate in a ring, there are two conditions at the boundaries that require additional circuitry to insure proper operation.

Bubbleback conditions exist in FIFO's when the FIFO is operating at or near the Full boundary. At the Empty boundary there is a similar condition called fallthrough. Both these conditions look very similar to each other and cause a distinction to be made and consequent action taken in order for the FIFO to function correctly.

Bubbleback in a FIFO is the situation when the FIFO is operating at or near the Full boundary, and the write pointer has "bubblebacked" or wrapped around to be on the same row of the memory array as the read pointer. This bubbleback condition is very similar to the fallthrough condition or when the FIFO is at or near the Empty boundary, the read and write pointers are on the same row and the data needs to "fallthrough" the FIFO as fast as possible. When the FIFO is operating in either of these conditions the read and write pointer are on the same row. However, in the fallthrough condition the write pointer is ahead of the read pointer and the data must be written through the FIFO and the memory cell, or "fallthrough" the FIFO, while in the bubbleback condition the write pointer is behind the read pointer and the data that is contained in the cells ahead of the read pointer must not be disturbed.

The above mentioned distinction between the fallthrough and bubbleback conditions cause designers to provide several safety precautions. In a first precaution, circuits have been designed to precharge the write bitlines to a high level before turning on the write wordline. This is done so that in the bubbleback condition the memory cells ahead if the read pointer in the same row are not disturbed with invalid data that may have been left on the write bitlines. This precaution requires extra circuitry to be designed around the write wordline activation circuitry to precharge the write bitlines AND consumes more active ICC due to the write bitline precharge, which can be eliminated with the invention.

In a second precaution, circuit designers were required to use a memory cell design that is stable when both read and write wordlines were active. This precaution requires a larger memory cell.

In a third precaution, much complex circuitry was designed and simulated for functionality in case the fallthrough circuitry was activated during an actual bubbleback condition. This had to be designed for because of the decode techniques used to determine if the read and write wordlines were equal. This required more extensive design schedules.

During bubbleback, as illustrated in FIG. 1, the write pointer is behind the read pointer but the wordlines are actually equal. At this point the data in memory cells 6 and 7 have not been read and circuitry has to be designed to insure that they are not inadvertently written, either through leftover write bitline data, cell instability, or fallthrough circuitry inadvertently being activated.

In older FIFO's, the architecture used to handle the fallthrough and bubbleback conditions was different. To improve the fallthrough timing the write bitlines were shorted to the tbus/tbusb whenever the write and read pointers were on the same row. In a bubbleback condition this is unnecessary. The control signal that enables this shorting was derived from extensive logic that could distinguish between the conditions when the FIFO is close to being full or close to being empty.

The main disadvantage of the old method is the fact that it involves extensive logic to derive this function that determines whether to short the write bitlines to the tbus/tbusb when the read and write pointers are pointing to the same row. For bubbleback situations, this condition necessitated the precharging of the write bitlines between writes that could otherwise cause the memory cell to be overwritten. The timing of the column selects and the shorter signals were made more critical. In some previous designs, this led to critical race conditions.

SUMMARY OF THE INVENTION

The present invention provides a method and apparatus for preventing the overwrite of information in a FIFO buffer memory. This method involves adding one or more rows to the memory array. This extra row is in addition to the desired size of the FIFO buffer. When the memory array is used such that the read and write pointers operate like a ring counter, the closest the read and write pointers can get, other than the empty and fallthrough case, is one row.

The purpose of this invention is to entirely eliminate the distinction between the fallthrough and bubbleback conditions, to eliminate the need for the write bitline precharge, and to reduce the size of the memory cell needed. This invention leads to the reduction of complex logic that would otherwise be necessary and thus makes the design very simple, efficient, and less risky.

DESCRIPTION OF THE PREFERRED EMBODIMENT

As stated previously, in typical FIFO buffer memories a problem exists when the write pointer and the read pointer are on the same row and the write pointer is behind the read pointer. In this situation, only the cells between the read and write pointers are empty. In a FIFO buffer memory having many rows, this is a condition in which the memory array is almost full.

Figure 1:
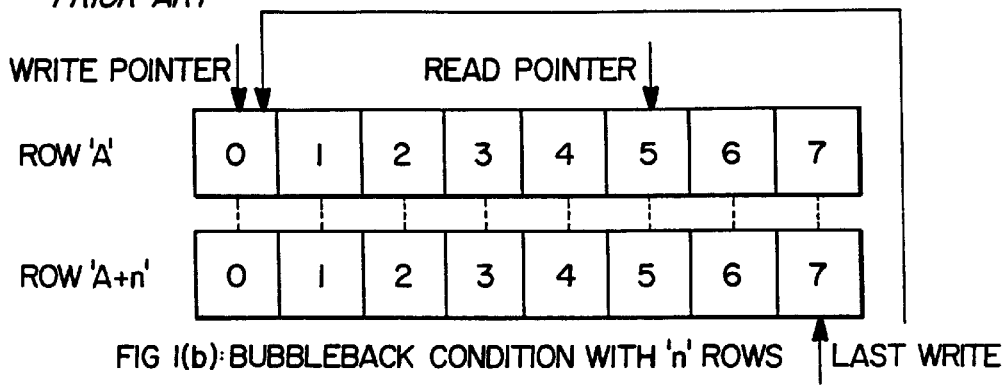
FIG. 1 is a simple block diagram of two select rows of cells of a FIFO memory, the first row and the last row.

Referring to FIG. 1, a single row of a FIFO buffer is illustrated with the write pointer in cell 0 and the read pointer in cell 5. Also illustrated in FIG. 1 is an additional row, row A+n. Row A+n may be considered as the last row and so cell 7 of row A+n may be considered the 1024 cell of a 1024 cell or 1K FIFO memory.

FIG. 1 shows the prior art operation near the full boundary. Here "n" is the total number of rows actually required. Let us assume the read pointer is pointing to cell 5 on row A and the write pointer is pointing to cell 7 on row A+n. In this case, the FIFO is five words away from being full. Referring again to FIG. 1, cell 7 on row A+n was written during the last write operation. The next write operation increments the write pointer, causing it to wrap around, to row A and cell 0 and writes the cell. This is indicated in FIG. 1 by the arrow pointing to row A cell 0 from row A+n cell 7. As is evident, this sequence of events has caused the write pointer to point to the same row as the read pointer but the write pointer is located behind the read pointer in the row. For this situation, known as bubbleback, there are several circuit considerations that must be dealt with, write bitline precharge, memory cell stability, and complex logic to determine if the case is fallthrough or bubbleback.

Figure 2:
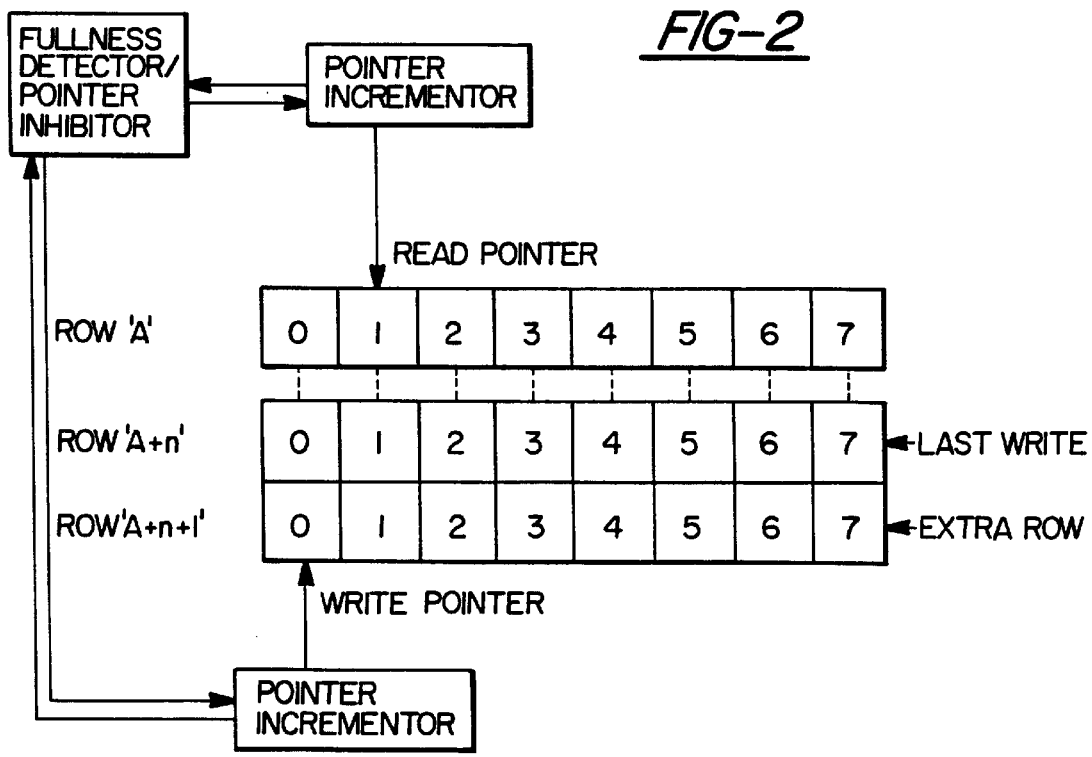
FIG. 2 is a block diagram of the present invention showing the first row and the last two rows of a FIFO memory.

Referring to FIG. 2, a row arrangement of the present invention is illustrated. As in FIG. 1, rows A and rows A+n are illustrated. In addition, a row A+n+1 has been added to the FIFO memory. In the actual design two rows were added because of layout issues. In FIG. 2, it should be noted that although the row identified by A represents the first row, it could be any one of the rows in the FIFO memory and that all other rows are shown to be located at a certain distance from row A. Row A+n is used to represent the last row of the FIFO memory. Alternatively, the present invention provides a means for indicating when N-1 rows of cells in the buffer memory are full.

Circuits are well known throughout the art which detect the fullness of the FIFO memory. In the embodiment of the present invention, two additional rows, each with eight additional cells, has been added to the FIFO memory, although any number of additional rows may be added. For discussion purposes, only one additional row is illustrated.

FIG. 2 illustrates the improved bubbleback conditions of the FIFO, the last write operation was writing cell 7 on row A+n. The extra row added which is shown as row A+n+1, enables the write pointer to advance to a row which is different from the one pointed to by the read pointer. While the FIFO is still operating at the full boundary, this technique avoids the situation shown in FIG. 1 which would cost complex logic in order to make a distinction between the fallthrough and the bubbleback conditions. This race condition has totally been eliminated by using this approach. Besides this, it also eliminates the need for precharging the write bitlines between writes without having to worry about the old data on the write bitlines overwriting the memory cells that have not been read. In the present invention, the write pointer moves from cell 7 of row A+n to cell 0 of row A+n+1 and may write data in the cells in row A+n+1 until a full memory is detected, at which time the write pointer is disabled. Thus, since the FIFO memory will be full and the write pointer will be disabled prior to the write pointer moving to row A. In this manner, the write pointer will never be located in the same row as the read pointer.

Figure 3:
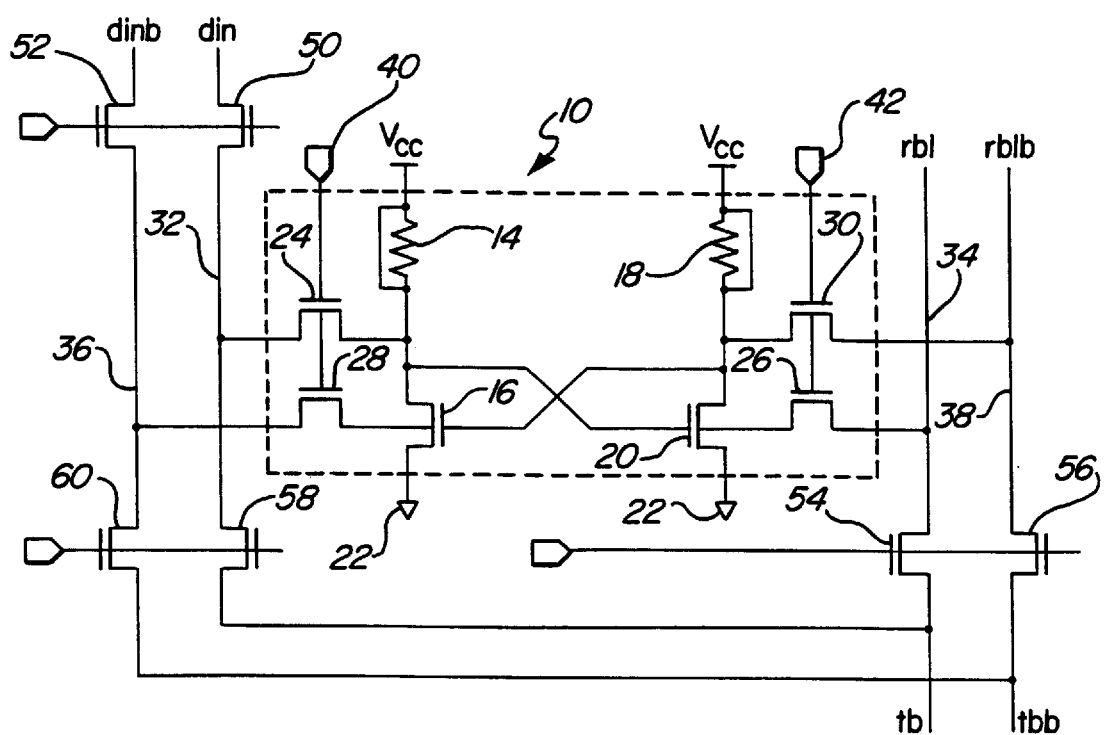
FIG. 3 is a schematic drawing of a typical FIFO memory cell.

Referring now to FIG. 3, a typical dual port memory cell 10 is illustrated in the dotted box. This memory cell is representative of the more than one thousand that are contained in a nominal 1K memory array.

The dual port memory cell used in the FIFO is shown in FIG. 3 along with the bare minimum column circuitry. The write and read bitlines have pass transistors that are enabled by the signals wy and ry for writing to and reading from the FIFO respectively. The following acronyms are used for the signal names in FIG. 3.

wwl—write wordline enable
rwl—read wordline enable
wbl—write bitline
wblb—write bitline bar
rbl—read bitline
rblb—read bitline bar
wy—write column select
ry—read column select
tb—input to sense amp
tbb—input to sense amp
din—output of data input driver
dinb—output of data input driver Dual port memory cell 10 shows one example of a FIFO memory which includes a voltage supply, $V_{cc}$, with a resistor 14 connected to the voltage supply, $V_{cc}$, and an N-channel MOS transistor 16 having its drain connected to the resistor 14. In parallel with the resistor 14 and transistor 16 is another resistor 18 connected to the voltage supply terminal $V_{cc}$, and another N-channel MOS transistor 20 having its drain connected to the resistor 18. The sources of the transistors 16 and 20 are connected to ground terminals 22. The drain of transistor 16 is connected to the gate of transistor 20 while the drain of transistor 20 is connected to the gate of transistor 16.

N-channel MOS transistors 24 and 26 have their sources connected to the drain of the transistor 16, while N-channel MOS transistors 28 and 30 have their sources connected to the drain of the transistor 20. The drain of the transistor 24 connects to the external write bitline 32, while the drain of the transistor 26 connects to the external read bitline 34. Similarly, the drain of transistor 28 connects to another external write bitline 36 while the drain of transistor 30 connects to another external read bitline 38. The gates of transistors 24 and 28 connect to the external write wordline 40, while the gates of transistors 26 and 30 connect to the external read wordline 42.

Data is communicated from a data input line through a buffer (not shown) to write bitline 32 and through an inverter (not shown) to write bitline 36. Thus, whatever the state of the input signal, the write bitline 32 and write bitline 36 will carry opposite values (D and Db). Assuming, for example, that a 1 is provided as the input signal on line 32 to be written into the memory cell 10, write bitline 32 will carry a high signal and write bitline 36 will carry a low signal. Write wordline enable 40 is activated to turn transistors 24 and 28 on, so that the drain of transistor 16 goes high, turning the gate of transistor 20 on and bringing the drain of transistor 20 and the gate of transistor 16 low, so that transistor 16 is off and transistor 20 is on.

Write bitlines 32 and 36 have pass transistors 50 and 52, respectively, that are enabled by signal wy for writing to the FIFO. Read bitlines 34 and 38 have pass transistors 54 and 56 that are enabled by signal ry for reading from the FIFO. Lines 32 and 36 are connected to lines tb and tbb through transistors 58 and 60, respectively. Transistors 58 and 60 are enabled by signal wyshrt, write tbus shorter.

Assuming that data is needed to be read from memory cell 10, read row line 42 is activated, turning on transistors 26 and 30. The cell's data is placed on read bitlines 34 and 38 and the data applied to a sense amplifier, thus communicating with a line from which the ultimate output is taken.

To achieve the goal of eliminating the bubbleback case from the design, additional rows were added to the memory array so that in the bubbleback case, illustrated in FIG. 2, the read and write wordlines are different. By achieving this goal, this invention leads to the reduction of complex logic and circuit design that would otherwise be necessary and thus makes the design very simple and efficient. To achieve a design with one or more extra rows efficiently, a shift register approach to the wordline decode was adopted. This shift register decode is also very simple and consumes less area than the traditional binary address decode.

The technique described here is very simple, highly efficient and it entirely eliminates the circuit considerations in the bubbleback case. This method assures that the timing of signals like column select and bitline precharging are non-critical and thus makes it a very stable and efficient design. The addition of the two extra rows to the memory array does not in any way affect the normal operation of the FIFO nor pave way for new problems that could arise from a complex logic or a circuit solution.

In prior art designs where the read and the write wordlines could be accessing the same row, in the bubbleback condition, a precharge was required before beginning a write cycle. This write precharge was required because old data would be left on the write bitlines from the previous write. When the write wordline would turn on, this old data would be written into the memory cells. Since some of the cells on that row may not have been read yet, in the bubbleback condition, a functional failure would occur. Since the present invention will never allow the read and the write wordlines to be in the same row during bubbleback condition the write precharge is no longer needed. The elimination of the write bitline precharge reduces the amount of logic, thereby reducing the layout area, as well as reducing the active current requirements because the bitlines are no longer precharged. However, in the design of the present invention, the write bitline precharge may still be done to speed up the write to the memory cell.

Another advantage of the present invention is that it greatly improves memory cell stability. This can be taken advantage of in two ways. First, the extra stability can be kept in the cell and used to offset other normal memory cell instabilities (i.e., alpha radiation, nondestructive defects in the silicon, and poly load resistor variations). Second, the memory cell size may be reduced by reducing the effective beta ratio, the ratio of transistors 20 to 28 and 30. Normally, this ratio is referred to as the memory cell "beta ratio". This ratio is a conductance ratio that can be expressed as the following equation: $(\text{Width}_{20}/\text{Length}_{20})/(\text{Width}_{30}/\text{Length}_{30}+\text{Width}_{28}/\text{Length}_{28})$. Typical poly resistor load memory cells have a beta ratio between 2.5 and 3. The higher this number, the more stable the memory cell, so it can be seen that there is a lower limit on how small transistor 20 could be made in the past based on the smallest transistor width that can be fabricated for transistors 30 and 28. Using the present invention transistor 20 can be made half as wide because the beta ratio equation above now looks like: $(\text{Width}_{20}/\text{Length}_{20})/(\text{Width}_{30}/\text{Length}_{30})$ OR $(\text{Width}_{20}/\text{Length}_{20})/(\text{Width}_{28}/\text{Length}_{28})$, whichever is smaller. The reason for the change in the beta ratio equation is that only one of transistors 30 or 28 will never be on when the memory cell has to maintain the original read data, or the bubbleback case. The same logic above applies to transistors 16, 24, and 26. Since the present invention was first used on a "small" 4K×9 FIFO, it was decided to keep the extra stability to improve yields.

As described, the present invention provides a method and apparatus for avoiding the bubbleback conditions in FIFO memories and all of the circuit considerations associated with bubbleback.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

We claim:

1. An apparatus for preventing the overwrite of information in a FIFO memory having N rows of cells, a write pointer and a read pointer, wherein the distance between said read pointer and said write pointer indicates the fullness of said FIFO, said apparatus comprising:

a detection circuit configured to indicate when N−1 rows of cells in the memory are full; and a disable circuit configured to inhibit the write pointer during times the indication of N−1 rows of cells being full is present.

2. A method for preventing the overwrite of information in a FIFO buffer memory having N rows of cells, a write pointer and a read pointer, wherein the distance between said read pointer and said write pointer indicates the fullness of said FIFO, said method comprising the steps of:

indicating when N−1 rows of cells in the memory are full; and inhibiting said write pointer during times when the indication of N−1 rows of cells being full is present.

3. A method for preventing the overwrite of information in a FIFO memory having N+1 rows of cells and having a write disable circuit operative when N rows of cells contain data, said method including the steps of:

reading from the Nth row of cells;

writing data into row N+1; and disabling a write pointer during times when the indication of N rows of cells of the buffer memory being full is present.

4. The method according to claim 3, wherein the distance between the read pointer and the write pointer indicates the fullness of said FIFO.

5. The method according to claim 3, further comprising the step of:

detecting a full memory when said read pointer is within one row of said write pointer.

6. An apparatus for preventing the overwrite of information in a FIFO memory having N rows of cells and having circuitry for indicating when N rows of cells in the buffer memory are full, said apparatus comprising:

memory cell means in addition to the N rows of cells; and means for disabling a write pointer during times when N rows of cells are full.

7. An apparatus for preventing the overwrite of information in a FIFO memory having N rows of cells, a read pointer and a write pointer, wherein the distance between said read pointer and said write pointer indicates the fullness of said FIFO, said apparatus comprising:

at least one memory cell in addition to the N rows of cells;

a detector circuit configured to indicate when N rows of cells are full; and a flag disable circuit for disabling the write pointer when said N rows of cells are full.

8. The apparatus according to claim 7 further comprising:

a circuit for writing to said at least one memory cell in addition to the N rows of cells.

9. The apparatus according to claim 7 wherein said at least one memory cell comprises the last row of the memory.

10. The apparatus according to claim 9 further comprising:

a circuit for writing to an Nth row of cells.

11. The apparatus according to claim 10 wherein the Nth row is the last row of the memory.

* * * * *